United States Patent
Zhang et al.

(10) Patent No.: US 8,766,958 B2
(45) Date of Patent: Jul. 1, 2014

(54) GATE DRIVING CIRCUIT UNIT, GATE DRIVING CIRCUIT AND DISPLAY DEVICE

(75) Inventors: Shengdong Zhang, Shenzhen (CN); Congwei Liao, Shenzhen (CN); Changde He, Shenzhen (CN); Wenjun Dai, Shenzhen (CN)

(73) Assignee: Peking University Shenzhen Graduate School, Shenzhen (CN)

( * ) Notice: Subject to any disclaimer, the term of this patent is extended or adjusted under 35 U.S.C. 154(b) by 214 days.

(21) Appl. No.: 13/386,030

(22) PCT Filed: Jan. 26, 2011

(86) PCT No.: PCT/CN2011/070658
§ 371 (c)(1), (2), (4) Date: Apr. 6, 2012

(87) PCT Pub. No.: WO2011/095099
PCT Pub. Date: Aug. 11, 2011

(65) Prior Publication Data
US 2012/0188210 A1    Jul. 26, 2012

(30) Foreign Application Priority Data
Feb. 8, 2010    (CN) .......................... 2010 1 0111791

(51) Int. Cl.
*G09G 5/00*    (2006.01)
(52) U.S. Cl.
USPC ............................................ 345/204; 345/99
(58) Field of Classification Search
CPC .............. G09G 3/3611; G09G 3/3674; G09G 2310/0286; G09G 2310/0289; G09G 2310/0264
USPC ................. 345/55, 87, 90, 98–100, 103, 204; 377/64, 72
See application file for complete search history.

(56) References Cited

U.S. PATENT DOCUMENTS

| 5,410,583 A | * | 4/1995 | Weisbrod et al. | ............... 377/75 |
| 6,295,046 B1 | * | 9/2001 | Hebiguchi | ................... 345/100 |

(Continued)

FOREIGN PATENT DOCUMENTS

| CN | 1508770 A | 6/2004 |
| CN | 1514421 A | 7/2004 |

(Continued)

OTHER PUBLICATIONS

International Search Report dated May 5, 2011 for International Application No. PCT/CN2011/070658, filed Jan. 26, 2011 (6 pages).

*Primary Examiner* — Joe H Cheng
(74) *Attorney, Agent, or Firm* — Perkins Coie LLP

(57) ABSTRACT

A gate driving circuit unit, a gate driving circuit and a display device are disclosed. The gate driving circuit unit comprises: a first clock signal control module, an input signal control module, a third clock signal control module and a fourth clock signal control module, wherein the first clock signal control module comprises a driving unit and a clock feed-through suppressing unit. The driving unit transmits a first clock signal to an output port after being switched on. The clock feed-through suppressing unit couples the control end of the driving unit to a signal output interface under control of the first clock signal. The input signal control module provides the driving voltage for the driving unit under control of an input pulse signal. The third clock signal control module provides the shutdown voltage for the driving unit.

48 Claims, 14 Drawing Sheets

(56) References Cited

U.S. PATENT DOCUMENTS

| | | | |
|---|---|---|---|
| 7,233,308 B2* | 6/2007 | Park | 345/100 |
| 7,333,586 B2* | 2/2008 | Jang | 377/64 |
| 7,420,536 B2* | 9/2008 | Jang et al. | 345/100 |
| 7,486,268 B2* | 2/2009 | Jang et al. | 345/100 |
| 7,489,758 B2 | 2/2009 | Lan | |
| 7,529,333 B2* | 5/2009 | Kim et al. | 377/64 |
| 7,872,628 B2* | 1/2011 | Cho | 345/100 |
| 2003/0107909 A1* | 6/2003 | Nakamura | 365/63 |
| 2004/0113878 A1 | 6/2004 | Park | |
| 2004/0125069 A1 | 7/2004 | Park et al. | |
| 2007/0182688 A1* | 8/2007 | Jang | 345/98 |
| 2007/0297559 A1* | 12/2007 | Cho et al. | 377/64 |
| 2008/0174580 A1* | 7/2008 | Chang et al. | 345/205 |
| 2010/0026619 A1* | 2/2010 | Umezaki | 345/100 |
| 2010/0073355 A1* | 3/2010 | Chun et al. | 345/213 |
| 2010/0321372 A1 | 12/2010 | Iwamoto et al. | |

FOREIGN PATENT DOCUMENTS

| | | |
|---|---|---|
| CN | 1689067 A | 10/2005 |
| CN | 101625840 A | 1/2010 |
| CN | 101783124 A | 7/2010 |
| WO | 2004025618 A1 | 3/2004 |
| WO | 2009104306 A1 | 8/2009 |

* cited by examiner

US 8,766,958 B2

GATE DRIVING CIRCUIT UNIT, GATE DRIVING CIRCUIT AND DISPLAY DEVICE

CROSS REFERENCE TO RELATED APPLICATIONS

This patent application is a 371 application of International Application No. PCT/CN2011/070658, filed Jan. 26, 2011, which claims priority to Chinese Patent Application No. 201010111791.7, filed Feb. 8, 2010. The entire contents of the before-mentioned patent applications are incorporated by reference as part of the disclosure of this application.

TECHNICAL FIELD

The present invention relates to a display device, particularly relates to a gate driving circuit of a display device.

BACKGROUND

Currently, amorphous silicon TFT (a-Si) technology has become the dominant technology in flat panel display industry because it has the advantages over its counterparts, such as, low fabrication temperature, uniform characteristics over large area, low cost and mature process.

In recent years, integrated gate driving circuits with a-Si TFT has attracted great attention in order to further improve the performance of the amorphous silicon TFT LCD and reduce its cost. Conventionally, bonding methods, such as chip on board (COB), tape automated bonding (TAB), chip on glass (COG), etc., have been used to connect peripheral ICs to flat display panels. Compared with such common scheme, integrated gate driving circuits with TFTs can not only reduce the number of external ICs and simplify bonding connections, but also light, thin and symmetrical display panels with narrow bezel is made possible. Therefore, LCD modules will become more compact, reliable with lower cost.

Designing an integrated circuit with a-Si TFT usually faces two problems. One is that the carrier mobility of a-Si is too low to provide large driving current, which lowers the speed of circuit. Another is that a threshold voltage ($V_T$) of a-Si TFT will shift under a long time electric stress, and such $V_T$ shift may cause the circuit to be unstable and even disabled.

So far, several solutions of integrated a-Si TFT gate driver to solve these two problems have been reported. The reported circuits usually use gate voltage bootstrapping to enhance the driving ability of a pull-up TFT. And the pull-down TFTs are turned-off every half period by two complementary clocks to eliminate $V_T$ shift. These schemes usually use more than ten transistors in one unit. However, there are obvious disadvantages in such gate drivers using two-phase clock, such as high power consumption, poor stability, high circuit complexity etc, which restrict integrated gate driver from being used in high performance applications. For this reason, it is desirable to integrate gate driver with low power consumption and good reliability.

SUMMARY

The technical problem to be solved by the present application is to provide a gate driving circuit unit, a gate driving circuit and a display device, which are capable of reducing complexity of circuits and power consumption and obtaining an improved stability.

In one aspect, a gate driving circuit unit is disclosed, which comprises:

a signal input interface for receiving an input pulse signal;
a signal output interface for outputting a driving signal;
a first clock signal control module comprising:
    a driving unit comprising a control end for transferring a first clock signal to the signal output interface after applied with a driving voltage; and
    a clock feed-through suppressing unit for coupling the control end to the signal output interface under control of the first clock signal; wherein the first clock signal lags one phase behind the input pulse signal;
an input signal control module for receiving the input pulse signal from the signal input interface and providing the driving voltage for the control end;
a third clock signal control module for providing a shut-down voltage for the control end under control of a third clock signal, the third clock signal lagging two phases behind the first clock signal; and
a fourth clock signal control module for pulling down the voltage of the signal output interface under control of a fourth clock signal, the fourth clock signal being one phase ahead of the first clock signal.

Wherein the first clock signal, the third clock signal and the fourth clock signal are three N-phase clock signals with a same cycle, where N is an integer that is larger than or equal to 4; and the value of one phase is equal to $2\pi/N$.

In one embodiment, the input signal control module is used to charge the control end of the driving unit under control of the input pulse signal. The driving unit is used to input the first clock signal and transmit the first clock signal to the signal output interface after it is switched on by the driving voltage. The third clock signal control module is used to respond to a third clock signal and pull down a voltage of the control end under control of the third clock signal.

Another gate driving circuit unit is disclosed and comprises:

a signal input interface for receiving an input pulse signal;
a signal output interface for outputting a driving signal;
a first clock signal control module comprising:
    a driving unit comprising a control end for transferring a first clock signal to the signal output interface after applied with a driving voltage; and
    a clock feed-through suppressing unit for coupling the control end to the signal output interface under control of the first clock signal; wherein the first clock signal lags one phase behind the input pulse signal;
an input signal control module for receiving the input pulse signal from the signal input interface, and providing a driving voltage for the driving unit under control of the input pulse signal;
a second clock signal control module for pulling down a voltage of the signal output interface under control of a second clock signal, the second clock signal lagging one phase behind the first clock signal;
a third clock signal control module for providing a shut-down voltage for the control end under control of a third clock signal, the third clock signal lagging two phases behind the first clock signal; and
a fourth clock signal control module for pulling down a voltage of the signal output interface under control of a fourth clock signal, the fourth clock signal being one phase ahead of the first clock signal.

The first clock signal, the second clock signal, the third clock signal and the fourth clock signal are M-phase clock signals with a same cycle, where M is an integer that is larger than or equal to 4; and the value of one phase equals to $2\pi/M$.

In another aspect, a gate driving circuit is disclosed and comprises any one of the gate driving circuit units as described above, wherein a signal output interface of a next unit of the gate driving circuit units is coupled to a signal input interface of a current unit of the gate driving circuit units, and wherein at least one of the gate driving circuit units comprises the gate driving circuit unit as described in the above, and a clock signal applied to the next unit lags one phase behind that applied to the current unit.

In yet another aspect, a display device is disclosed and comprises: a panel comprising a two-dimensional pixel array consisted of a plurality of pixels;

a plurality of data lines in a first direction and a plurality of gate scanning lines in a second direction, both of the data lines and the gate scanning lines being connected to each pixel array; and a data driving circuit for providing an image signal for the data lines;

wherein the display device further comprises the gate driving circuit as described in the above for providing a driving signal for the gate scanning lines.

With a design of the multi-phase clock, the functions of the gate driving circuit may be achieved by only using a few of transistors, and thus the complexity of the circuit design as well as the area and the power consumption of the gate driving circuit will be reduced. In addition, the stability of the gate driving circuit will be improved accordingly.

DETAILED DESCRIPTION

The embodiments of the present application will be described in detail below with reference to the appended drawings.

Figure 1:
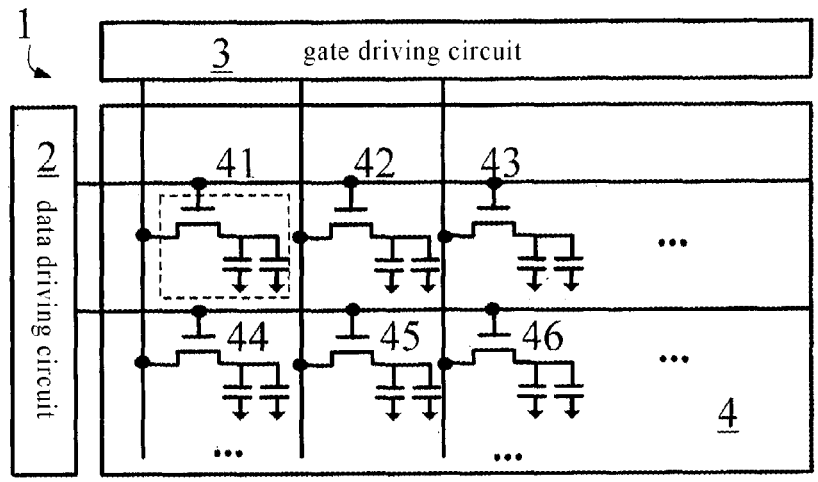
FIG. 1 is a block diagram exemplarily illustrating a structure of a display device.

As shown in FIG. 1, a display device 1 comprises a panel 4, a data driving circuit 3, and a gate driving circuit 2. The panel 4 comprises a two-dimensional pixel array consisted of a plurality of pixels 41, 42, 43, 44, 45, 46, and a plurality of data lines in a first direction (for example, a vertical direction) and a plurality of gate scanning lines in a second direction (for example, a horizontal direction) both of which are connected to each pixel array. In FIG. 1, as will be appreciated by those of skill in the art, although pixels 41, 42, 43, 44, 45, 46 are shown, the number of the pixels included in each row and column is determined in accordance with the specific conditions of the panel. Generally, each gate scanning line corresponds to one row in the pixel array, and each data line corresponds to one column in the pixel array. The data driving circuit 3 may output an image signal to the data line, and the gate driving circuit 2 may output a driving signal to the data line so as to perform row scanning of the pixel array. The gate driving circuit may be connected to the panel by welding. Alternatively, the gate driving circuit 2 may be integrated on the panel. The display device 1 may be a liquid crystal display, an organic light emitting display, or an electronic paper display, etc.

Figure 2:
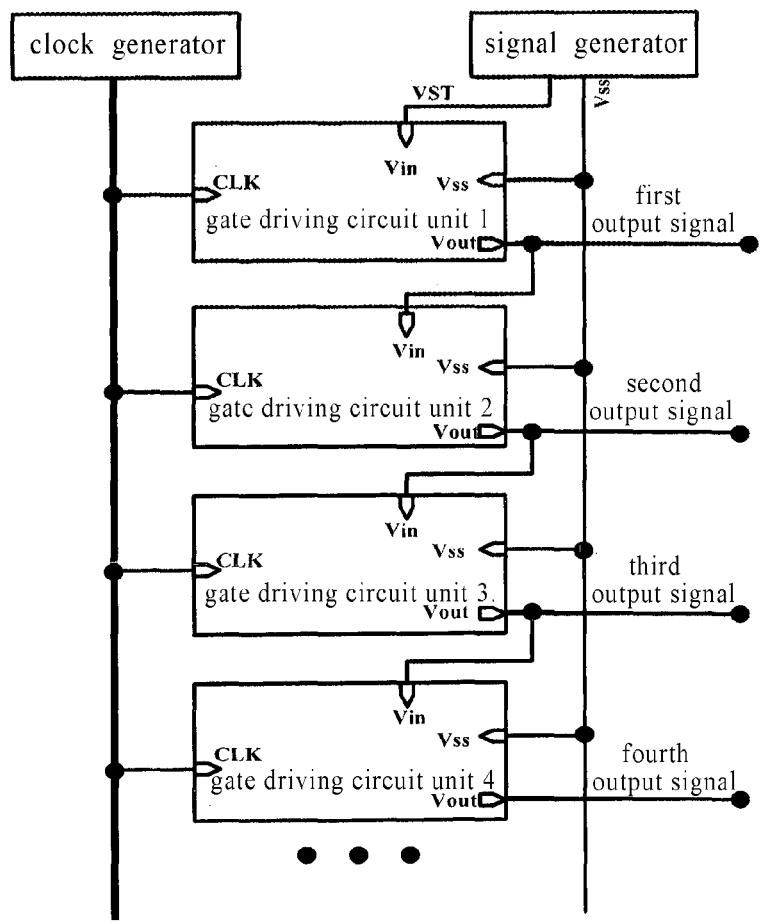
FIG. 2 is a block diagram exemplarily illustrating a structure of a gate driving circuit according to the present invention.

FIG. 2 is a structural block diagram showing the gate driving circuit 2. The gate driving circuit 2 comprises multiple stages of gate driving circuit units connected in series, wherein a signal output interface $V_{out}$ of the gate driving circuit unit at a preceding stage is coupled to a signal input interface $V_{in}$ of the gate driving circuit unit at a following stage. An input signal of the driving circuit unit at the first stage is provided by a signal generator, and a signal output $V_{out}$ of the driving circuit unit at each stage is connected to one corresponding gate scanning line of panel 4.

The signal generator is also used to provide a low level signal $V_{ss}$ to each stage of gate driving circuit unit.

A clock generator provides a clock signal to each gate stage of driving circuit unit.

Figure 3:
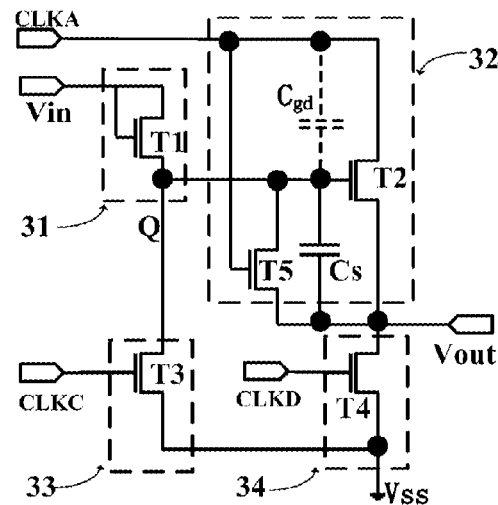
FIG. 3 is a circuit diagram exemplarily illustrating a gate driving circuit unit according to an embodiment of the present invention.

FIG. 3 shows a circuit diagram of the gate driving circuit according to a specific embodiment. Some terms will be explained at first.

A transistor may be a bipolar transistor or a field effect transistor. In the case of a bipolar transistor, a control electrode refers to the base of the bipolar transistor, and first and second main current conducting electrodes refer to the emitter and collector of the bipolar transistor, respectively. In the case of a field effect transistor, a control electrode refers to the gate of the field effect transistor, and first and second main current conducting electrodes refer to the source and drain of the field effect transistor, respectively. Generally, transistors in the display device are thin film transistors (TFTs). In this case, the control electrode of the transistor refers to the gate of the thin film transistor, and the first and second main current conducting electrodes refer to the drain and source of the thin film transistor, respectively.

The structure and operation of the gate driving circuit unit shown in FIG. 3 will be illustrated below by taking a TFT as an example of the transistor.

In the embodiment shown in FIG. 3, the gate driving circuit unit comprises: a signal input interface $V_{in}$, a signal output interface $V_{out}$, an input signal control module 31, a first clock signal control module 32, a third clock signal control module 33 and a fourth clock signal control module 34. An input pulse signal is received by the signal input interface $V_{in}$. A driving signal is outputted through the signal output interface $V_{out}$. The first clock signal control module 32 comprises a driving unit and a clock feed-through suppressing unit. The driving unit comprises a control end. The control end of the driving unit transfers a first clock signal to the signal output interface after receiving a driving voltage. The clock feed-through suppressing unit couples the control end to a signal output interface under the control of the first clock signal. The first clock signal lags one phase behind the input pulse signal. The input signal control module 31 is used to receive the input pulse signal from the signal input interface and provide the driving voltage for the control end of the driving unit. The third clock signal control module 33 is used to provide a shutdown voltage for the control end of the driving unit under the control of a third clock signal which lags two phases behind the first clock signal. The fourth clock signal control module 34 is used to pull down a voltage of the signal output interface under the control of a fourth clock signal which is one phase ahead of the first clock signal.

FIG. 3 shows the particular circuit structure of the gate driving circuit unit in one embodiment. The input signal control module 31 comprises a first transistor T1. The gate and drain of the first transistor T1 receive input signal $V_{in}$. The source of the first transistor T1 is used to output the driving voltage signal. The first clock signal control module 32 comprises the driving unit and the clock feed-through suppressing unit. The driving unit comprises a second transistor T2. The gate of the second transistor T2 is connected to the source of the first transistor T1. The gate of the second transistor T2 is the control end of the driving unit. The node connecting the source of the first transistor T1 and the gate of the second transistor T2 is defined as node Q. The first clock signal CLKA is input to the drain of the second transistor T2. The source of the second transistor T2 is connected to the signal output interface $V_{out}$, under the control of the gate voltage of the second transistor T2, for charging the signal output interface $V_{out}$ when a high level of the first clock signal CLKA arrives and for pulling down the potential of the signal output interface $V_{out}$ when a low level of the first clock signal CLKA arrives. The clock feed-through suppressing unit comprises a fifth transistor T5. The gate of the fifth transistor T5 responds to the first clock signal CLKA. The drain of the fifth transistor T5 is connected to the gate of the second transistor T2, and the source of the fifth transistor T5 is connected to the signal output interface $V_{out}$. The fifth transistor T5 is used to couple the gate of the second transistor T2 to the signal output interface $V_{out}$ when a high level of the first clock signal CLKA arrives while the signal output is at a low level so as to stabilize the gate potential of the second transistor T2. The third clock signal control module 33 comprises a third transistor T3. The gate of the third transistor T3 responds to a third clock signal CLKC. The drain of the third transistor T3 is connected to the gate of the second transistor T2, and the source of the third transistor T3 is connected to a first voltage source $V_{ss}$. The first voltage source $V_{ss}$ is used to provide a low level signal. The third transistor T3 is used to couple the gate of the second transistor T2 to the first voltage source $V_{ss}$ when a high level of the third clock signal CLKC arrives so as to pull down the gate potential of the second transistor T2. In the present embodiment, the fourth clock signal control module 34 comprises a fourth transistor T4. The gate of the fourth transistor T4 responds to a fourth clock signal CLKD. The drain of the fourth transistor T4 is connected to the signal output interface $V_{out}$, and the source of the fourth transistor T4 is connected to the first voltage source $V_{ss}$. The fourth transistor T4 is used to connect the signal output interface $V_{out}$ to the first voltage source $V_{ss}$ when a high level of the fourth clock signal CLKD arrives so as to pull down the voltage of the second transistor signal output interface $V_{out}$.

In the present embodiment, the three clock signals of the gate driving circuit unit shall meet the following conditions.

The first clock signal, the third clock signal and the fourth clock signal are N-phase clock signals with a same cycle. The duty cycle of each of these three clock signals is 1/N, and the value of each phase is of $2\pi/N$, wherein N is an integer that is larger than or equal to 4. The third clock signal CLKC lags two phases behind the first clock signal CLKA, and the fourth clock signal CLKD is one phase ahead of the first clock signal CLKA. The high level of each clock signal is $V_{dd}$, and the low level of each clock signal is $V_{ss}$.

Figure 4:
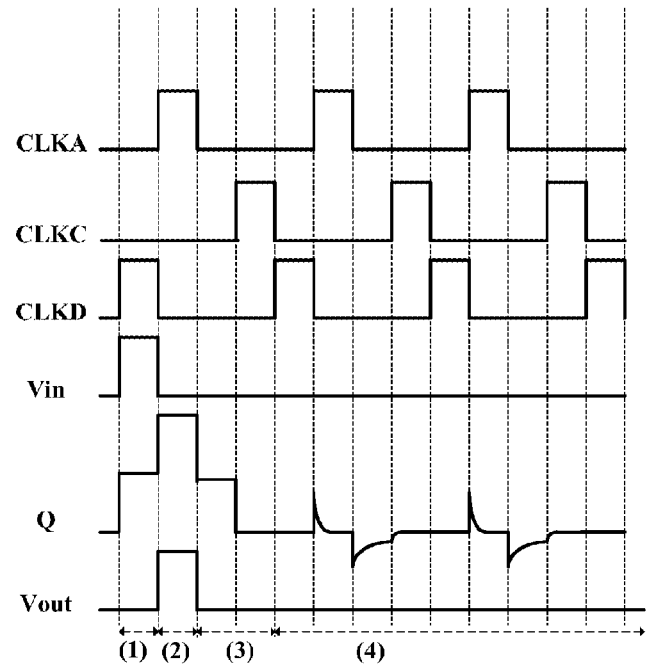
FIG. 4 is an exemplary signal diagram of a gate driving circuit unit according to an embodiment of the present invention.

As shown in FIG. 4, the operation of the gate driving circuit can be divided into four processes: precharge, pull-up, pull-down and low level maintenance. These four processes will be described below in detail.

(1) Precharge

During the precharge stage, node Q (i.e. the gate electrode of the second transistor T2) is charged up, before the voltage at the drain electrode of the second transistor T2 turns to high level. Thus, the second transistor T2 is already turned on before participating in charging load of scan line in the second direction.

In the precharge stage, each of the clock signals CLKA and CLKC is at a low level, the clock signal CLKD is at a high level, the input signal $V_{in}$ is at a high level, the first transistor T1 is on, and the potential on the node Q rises gradually. When the potential of the node Q becomes higher than the threshold voltage $V_{th}$ of the second transistor T2, the second transistor T2 will be switched on. As the clock signal CLKA is at a low level, the output signal $V_{out}$ will be maintained at a low potential. At this time, the third transistor T3, the fourth transistor T4 and the fifth transistor T5 are all at off-state. The potential of the node Q will reach $V_{dd}-V_{th}$ at the end of the precharge stage.

(2) Pull-Up

The pull-up stage is a process in which the drain of the second transistor T2 becomes a high level, and the transistor T2 in the on-state charges a load end, and finally pulls the potential of the signal output interface $V_{out}$ up to $V_{dd}$.

In the pull-up stage, the clock signal CLKA becomes the high level, the clock signals CLKC and CLKD are at the low level, and the first, third and fourth transistors T1, T3 and T4 are all at off-state. For this reason, the node Q is suspended, the second transistor T2 is maintained at on-state, and the clock signal CLKA provides charging current to load through the second transistor T2. The potential on the node Q will rise as the charging current is applied to the output interface $V_{out}$. This is called as bootstrap.

At the beginning of the pull-up stage, the fifth transistor T5 works in saturation region. The second transistor T2 is in linear region. When the output voltage reaches $V_{dd}$-$V_{th}$, the fifth transistor T5 will be switched off.

(3) Pull-Down

The pull-down stage is a process in which the output interface $V_{out}$ and the node Q is discharged through the second transistor T2, the third and fourth transistors T3, T4, so that the potentials of the output interface $V_{out}$ and the node Q are pulled down to $V_{ss}$, respectively.

The pull-down stage comprises two continuous processes, i.e. a first process and a second process. In the first process, the output interface $V_{out}$ is discharged. The clock signals CLKA, CLKC and CLKD are at a low level. Accordingly, the first transistor T1, the third transistor T3, the fourth transistor T4 and the fifth transistor T5 are all at off-state. At this time, because the second transistor is maintained at on-state while the drain level of the second transistor is $V_{ss}$, the potential of the signal output interface $V_{out}$ is pulled down to $V_{ss}$ through the second transistor T2.

In the second process, the node Q is discharged. The clock signal CLKC is at a high level and the clock signals CLKA and CLKD are at a low level. At this time, the third transistor T3 is switched on, and the stored charge at the node Q is discharged through the third transistor T3. The potential of the node Q thus drops. The second transistor T2 will be switched off after the potential of the node Q drops lower than $V_{th}$ of the second transistor T2.

When the clock signal CLKC is at a high level, the charge stored at the node Q must be discharged completely, otherwise, the second transistor T2 will still be at on-state, such that the integrity of low level state of the signal output $V_{out}$ will be impeded by the next high level of the first clock signal CLKA.

(4) Low Level Maintaining

The gate driving circuit unit will become a non-select state after the potential of the output interface is pulled down to $V_{ss}$. In this stage, the potential of the output interface $V_{out}$ must be maintained stably at the low level $V_{ss}$, so this stage is also referred to as low level maintaining stage.

If noise voltage exists in the signal output port $V_{out}$ of a gate driving circuit unit during the low level maintenance stage, the switching transistors of the pixels, which are connected to the signal output port $V_{out}$ of this unit will be turned on improperly so as to induce the mistaken image information in the panel.

In the low level maintenance stage, the first transistor T1 is at off-state, and the gate of the second transistor T2 will become a low level because the charger thereon is discharged during the clock signal CLKC is at a high level. Thus, the output signal $V_{out}$ should also be maintained at a low level.

However, due to the connection of the gate-drain parasitic capacitance $C_{GD}$, when the clock signal CLKA jumps from a low level to a high level, the gate potential $V_Q$ will also increases accordingly. When $V_Q$ becomes larger than the threshold voltage $V_{th}$ of the transistor T2, the transistor T2 will be switched on, the load capacitance will be charged, and the noise voltage will appear in the output signal $V_{out}$. In this case, it is necessary to maintain the output signal $V_{out}$ at a state of low level.

The present embodiment solve these problems from two aspects: preventing the noise voltage from appearing in the output driving signal, and eliminating the noise voltage in the output driving signal.

In order to prevent the noise voltage from appearing in the output driving signal, a fifth transistor T5 is added in the present embodiment. By adding the fifth transistor T5, the magnitude of the gate potential $V_Q$ of the second transistor T2 depends on the ratio of the magnitude of the parasite capacitance $C_{GD}$ of the second transistor T2 to the magnitude of the load capacitance of the output interface $V_{out}$. The value of the load capacitance of the output interface $V_{out}$ is far larger than the capacitance of the node Q. Therefore, $V_Q$ is reduced significantly such that the probability of turning on the second transistor T2 is reduced so as to reduce the probability of the appearance of the noise voltage.

Due to the added fifth transistor T5, when the clock signal CLKA jumps from a low level to a high level, the node Q will be at a high level because of the coupled gate-drain parasite capacitance of the second transistor T2. At this time, the fifth transistor T5 will be switched on under the control of the clock signal CLKA, and the node Q is connected directly to the output interface $V_{out}$, and the coupled charge on the node Q is discharged to the output interface $V_{out}$ through the fifth transistor T5, and the voltage of the node Q drops, so that the second transistor T2 can be maintained at off-state, and the output interface $V_{out}$ also can be maintained at a state of low level.

Due to the added fifth transistor T5, when the clock signal CLKA jumps from a high level to a low level, the node Q will be at a low level lower than $V_{ss}$ because of the coupled gate-drain parasite capacitance of the second transistor T2 that is pulled up. At this time, the third and fifth transistors T3, T5 are at off-state, and so is the second transistor T2. Thus, the output signal $V_{out}$ is still maintained at a state of low level until the clock signal CLKC become a high level and the third transistor T3 will be switched on, so that the potential of the node Q can re-increase up to $V_{ss}$.

On the other hand, in order to eliminate the noise voltage appearing in the output driving signal, a fourth transistor T4 is added in the present embodiment. When the clock signal CLKD is at a high level, the fourth transistor T4 becomes on and the signal output interface is connected to the ground. Accordingly, the noise charge at the signal output interface $V_{out}$ is discharged, which in turn avoids accumulating the noise charge at the signal output interface $V_{out}$ for a long time and eliminates the noise voltage in the output driving signal. Moreover, the clock signal CLKD is one phase ahead of the clock signal CLKA, that is to say, there exists a certain degree of overlap between the falling edge of the clock signal CLKD and the rising edge of the clock signal CLKD. When the clock signal CLKA is at the rising edge, the clock signal CLKD is at the falling edge, and the fourth transistor has not been switched off completely, so that the noise voltage at the signal output interface $V_{out}$ can be reduced.

Besides, when the clock signal CLKC is at a high level, the third transistor T3 becomes on and the node Q is connected to the ground. Accordingly, the noise charge at the node Q is discharged to avoid accumulating the noise charge at node Q for a long time, which in turn ensures the reliable turn-off of the second transistor T2 during the low level maintenance stage and prevent the second transistor T2 from pulling the voltage of the signal output interface $V_{out}$ up.

In another embodiment, the clock feed-through suppressing unit further comprises a storage capacitance Cs connected between the gate and source of the second transistor T2. With the added storage capacitance Cs, the ratio of the parasite capacitance Cgd of the transistor T2 to the capacitance of the node Q can be reduced, which in turn increases the value of the storage capacitance and reduces $V_Q$ so as to suppress the noise voltage of the output interface $V_{out}$. However, the storage capacitance Cs should not be too large; otherwise it will take an excessive circuit area.

The transistor T5 and the storage capacitance Cs collectively form the clock feed-through suppressing unit that is capable of reducing the noise in the output signal during the low level maintenance stage so as to make the output signal more stable.

In view of the above, compared with the two-phase clock driving scheme that requires more than ten transistors in the prior art, the gate driving circuit according to the present embodiment take a design of the multi-phase clock to accomplish its functions by only using very few number of transistors. Accordingly the complexity of the circuit design is reduced. On one hand it reduces the circuit design area and the power consumption and is more suitable for high quality display devices; on the other hand it improves the finished product rate.

In addition, the power consumption of the gate driving circuit is mainly dynamic consumption that is proportional to the clock frequency. In the present embodiment, three clock signals are designed, a clock signal with more than or equal to four-phase is utilized, and the frequency of the clock jump is reduced and thereby the power consumption is reduced.

In this embodiment, because the noise voltage is prevented from appearing in the output driving signal and the noise voltage in the output driving signal is eliminated, the output signal is maintained stable during the low level maintenance stage. It not only provides a stable driving signal for the pixel array, but also provides a stable input signal for next gate driving circuit unit, and thus improves the stability of the whole gate driving circuit and the image display quality.

Due to the using of the multi-phase clock driving, the duty cycle of the gate voltage signal of the pull-down transistor that experiences the voltage stress in the circuit is relatively small. So, the drift of the threshold voltage of the transistor is small, the degradation of the electrical characteristics is reduced, and the stability of the circuit is well. Consequently, the lifetime of the gate driving circuit is extended.

The following contents are given in reference to an example in which the number of the clock phase used in the gate driving circuit is four, six and eight.

In order to comply with requirements on the gate driving signal for the display device, when gate driving circuit units of several stages are connected in series, the clock signal of the gate driving circuit unit at a next stage lags one phase from the corresponding clock signal of the gate driving circuit unit at the current stage.

If the phase number of the clock signal is equal to N, the connecting method of the clock interface of the gate driving circuit at a k*N+1 stage is the same as that of the gate driving circuit at the first stage. Similarly, the connecting manner of the clock interface of the gate driving circuit at a k*N+2 stage is the same as that of the gate driving circuit at the second stage . . . and the connecting manner of the clock interface of the gate driving circuit at a k*N+i stage is the same as that of the gate driving circuit at the ith stage, where k is an integer that is larger than or equal to 1, and i is an integer that is larger than or equal to 0 and less than or equal to N−1.

Figure 5:
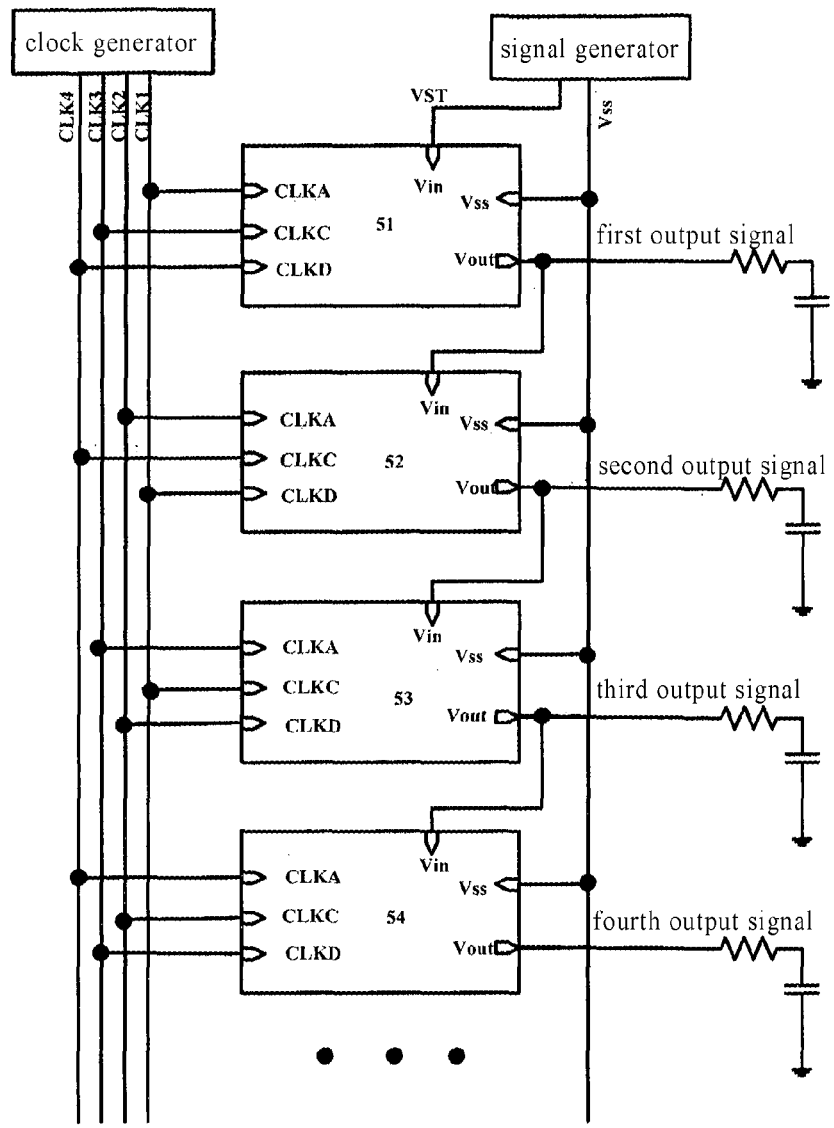
FIG. 5 is a circuit diagram exemplarily illustrating a gate driving circuit of a gate driving circuit unit according to an embodiment of the present invention, wherein the gate driving circuit is driven by a four-phase clock.

As shown in FIG. 5, the clock signals provided by the clock generator are four-phase signals CLK1, CLK2, CLK3 and CLK4 with a duty cycle of 25%. Now the specific connecting method of the clock of the gate driving circuit unit at each stage will be described as below.

The clock interface CLKA of the gate driving circuit unit 51 at the first stage is connected to the signal CLK1, the clock interface CLKC of the gate driving circuit unit 51 is connected to the signal CLK3, and the clock interface CLKD of the gate driving circuit unit 51 is connected to the signal CLK4. The clock interface CLKA of the gate driving circuit unit 52 at the second stage is connected to the signal CLK2, the clock interface CLKC of the gate driving circuit unit 52 is connected to the signal CLK4, and the clock interface CLKD of the gate driving circuit unit 52 is connected to the signal CLK1. The clock interface CLKA of the gate driving circuit unit 53 at the third stage is connected to the signal CLK3, the clock interface CLKC of the gate driving circuit unit 53 is connected to the signal CLK1, and the clock interface CLKD of the gate driving circuit unit 53 is connected to the signal CLK2. The clock interface CLKA of the gate driving circuit unit 54 at the fourth stage is connected to the signal CLK4, the clock interface CLKC the gate driving circuit unit 54 is connected to the signal CLK2, and the clock interface CLKD of the gate driving circuit unit 54 is connected to the signal CLK3 . . . and so on.

The connecting method of the other stages is that: if the remainder of the stage number divided by 4 is 1, the connecting method of the gate driving circuit unit at this stage is the same as that of the gate driving circuit unit at the first stage; if the remainder of the stage number divided by 4 is 2, the connecting method of the gate driving circuit unit at this stage is the same as that of the gate driving circuit unit at the second stage; if the remainder of the stage number divided by 4 is 3, the connecting method of the gate driving circuit unit at this stage is the same as that of the gate driving circuit unit at the third stage; if the stage number is divisible by 4, the connecting method of the gate driving circuit unit at this stage is the same as that of the gate driving circuit unit at the fourth stage.

Figure 6:
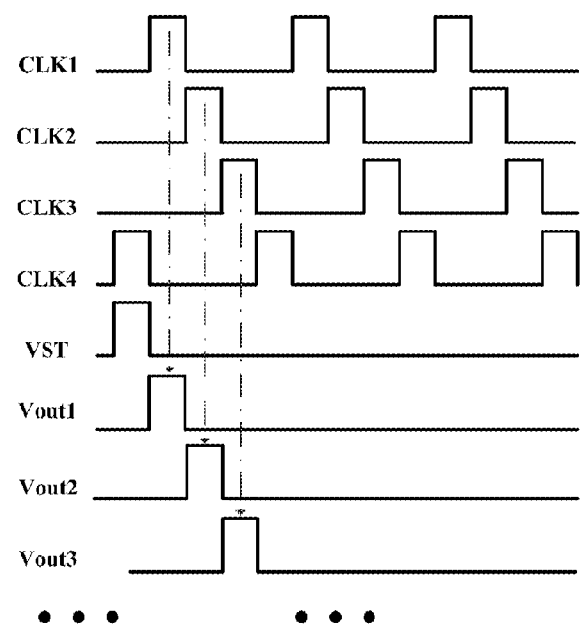
FIG. 6 is an exemplary signal diagram of a gate driving circuit of a gate driving circuit unit according to an embodiment of the present invention, wherein the gate driving circuit is driven by a four-phase clock.
Figure 7:
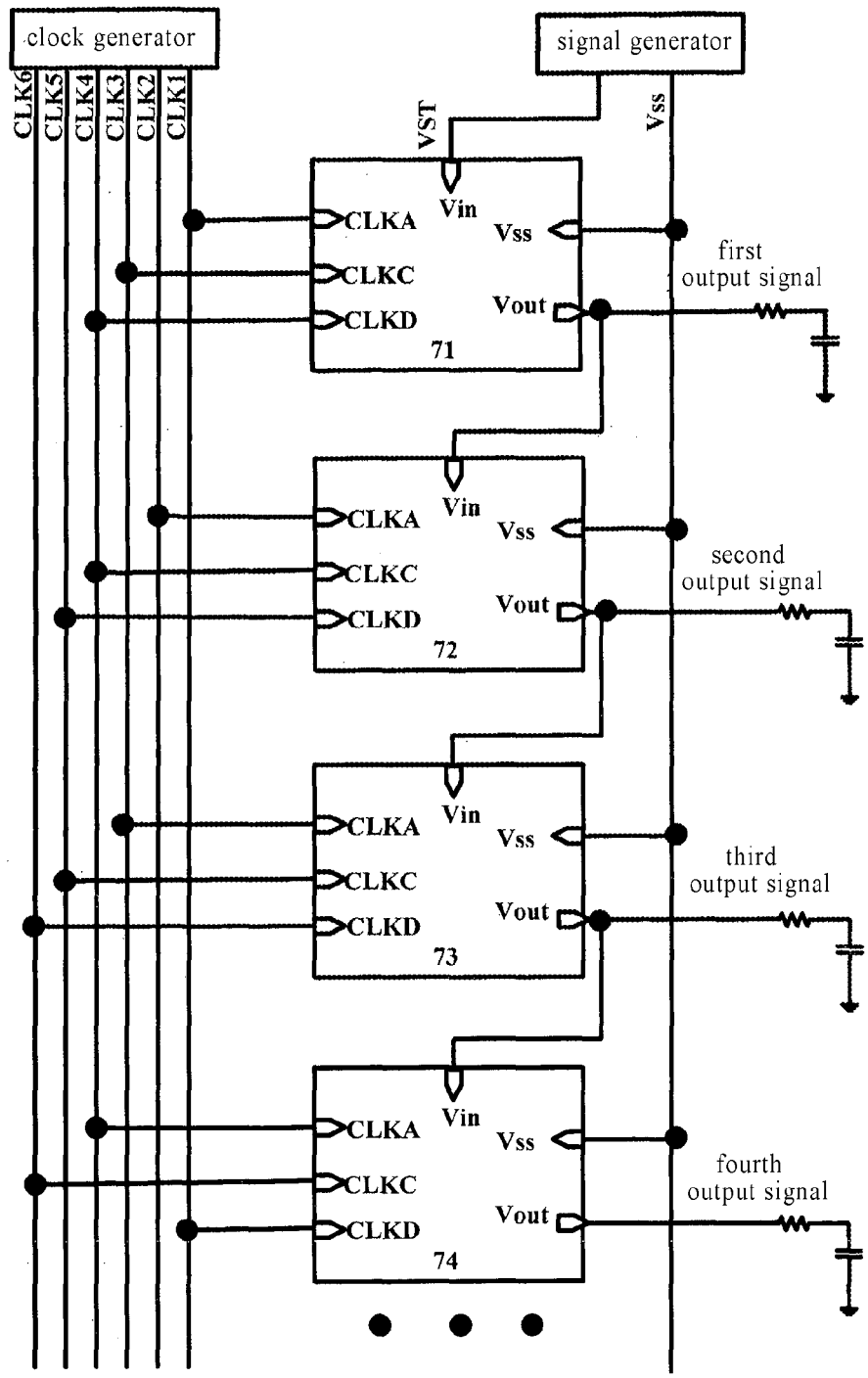
FIG. 7 is a circuit diagram exemplarily illustrating a gate driving circuit of a gate driving circuit unit according to an embodiment of the present invention, wherein the gate driving circuit is driven by a six-phase clock.

The operating signals with four-phase clock driving are shown in FIG. 6. Applied with the above four-phase clock signals and a start pulse signal, the gate driving circuit provides diving signals for each row of the load panel shown in FIG. 1.

In the present embodiment, the six-phase clock signals used in the gate driving circuit is shown in FIG. 5. The clock signals provided by the clock generator are six-phase signals CLK1, CLK2, CLK3, CLK4, CLK5 and CLK6 with a duty cycle of ⅙. The specific connecting method of the clock of the gate driving circuit unit at each stage is described as below.

The clock interface CLKA of the gate driving circuit unit 71 at the first stage is connected to the signal CLK1, the clock interface CLKC thereof is connected to the signal CLK3, and the clock interface CLKD thereof is connected to the signal CLK4. The clock interface CLKA of the gate driving circuit unit 72 at the second stage is connected to the signal CLK2, the clock interface CLKC thereof is connected to the signal CLK4, and the clock interface CLKD thereof is connected to the signal CLK5. The clock interface CLKA of the gate driving circuit unit 73 at the third stage is connected to the signal CLK3, the clock interface CLKC thereof is connected to the signal CLK5, and the clock interface CLKD thereof is connected to the signal CLK6. The clock interface CLKA of the gate driving circuit unit 74 at the fourth stage is connected to the signal CLK4, the clock interface CLKC thereof is connected to the signal CLK6, and the clock interface CLKD thereof is connected to the signal CLK1. The clock interface CLKA of the gate driving circuit unit (not shown) at the fifth stage is connected to the signal CLK5, the clock interface CLKC thereof is connected to the signal CLK1, and the clock interface CLKD thereof is connected to the signal CLK2. The clock interface CLKA of the gate driving circuit unit (not shown) at the sixth stage is connected to the signal CLK6, the clock interface CLKC thereof is connected to the signal CLK2, and the clock interface CLKD thereof is connected to the signal CLK3 . . . and so on.

The connecting method of the other stages is that: if the remainder of the stage number divided by 6 is 1, the connecting method of the gate driving circuit unit at this stage is the same as that of the gate driving circuit unit at the first stage; if the remainder of the stage number divided by 6 is 2, the connecting method of the gate driving circuit unit at this stage is the same as that of the gate driving circuit unit at the second stage; if the remainder of the stage number divided by 6 is 3, the connecting method of the gate driving circuit unit at this stage is the same as that of the gate driving circuit unit at the third stage; if the remainder of the stage number divided by 6 is 4, the connecting method of the gate driving circuit unit at this stage is the same as that of the gate driving circuit unit at the fourth stage; if the remainder of the stage number divided by 6 is 5, the connecting method of the gate driving circuit unit at this stage is the same as that of the gate driving circuit unit at the fifth stage; if the stage number is divisible by 6, the connecting method of the gate driving circuit unit at this stage is the same as that of the gate driving circuit unit at the sixth stage.

Figure 8:
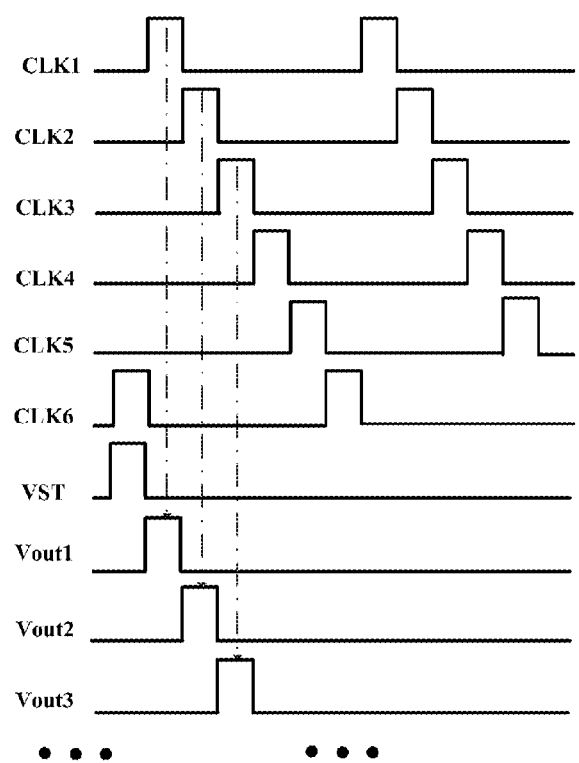
FIG. 8 is an exemplary signal diagram of a gate driving circuit of a gate driving circuit unit according to an embodiment of the present invention, wherein the gate driving circuit is driven by a six-phase clock.

The operating signals with six-phase clock driving are shown in FIG. 8. Applied with the above six-phase clock signals and a start pulse signal, the gate driving circuit provides diving signals for each row of the panel 4 shown in FIG. 1.

Figure 9:
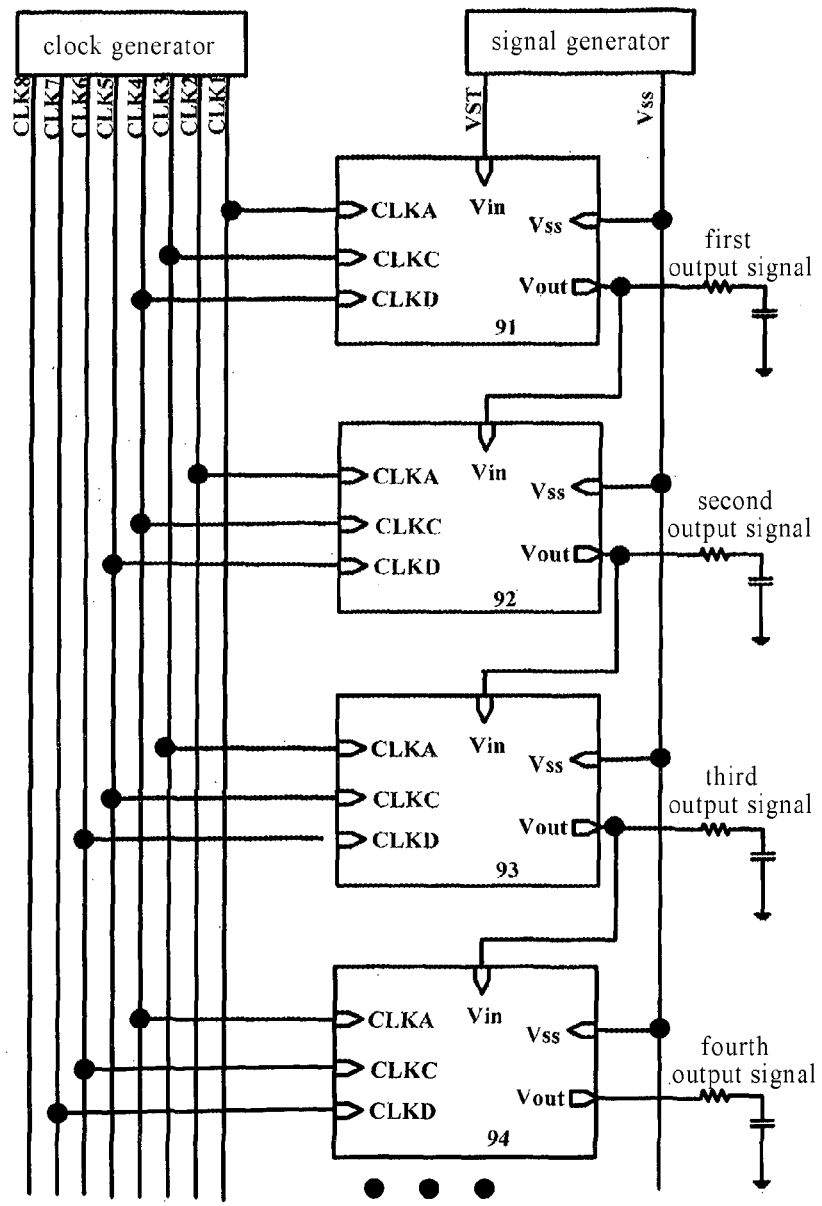
FIG. 9 is a circuit diagram exemplarily illustrating a gate driving circuit of a gate driving circuit unit according to an embodiment of the present invention, wherein the gate driving circuit is driven by an eight-phase clock.

In the present embodiment, the eight-phase clock signals used in the gate driving circuit are shown in FIG. 9. The clock signals provided by the clock generator are six-phase signals CLK1, CLK2, CLK3, CLK4, CLK5, CLK6, CLK7 and CLK8 with a duty cycle of ⅛. The specific connecting method of the clock of the gate driving circuit unit at each stage will be described as below.

The clock interface CLKA of the gate driving circuit unit 91 at the first stage is connected to the signal CLK1, the clock interface CLKC of the gate driving circuit unit 91 is connected to the signal CLK3, and the clock interface CLKD of the gate driving circuit unit 91 is connected to the signal CLK4. The clock interface CLKA of the gate driving circuit unit 92 at the second stage is connected to the signal CLK2, the clock interface CLKC of the gate driving circuit unit 92 is connected to the signal CLK4, and the clock interface CLKD of the gate driving circuit unit 92 is connected to the signal CLK5. The clock interface CLKA of the gate driving circuit unit 93 at the third stage is connected to the signal CLK3, the clock interface CLKC of the gate driving circuit unit 93 is connected to the signal CLK5, and the clock interface CLKD of the gate driving circuit unit 93 is connected to the signal CLK6. The clock interface CLKA of the gate driving circuit unit 94 at the fourth stage is connected to the signal CLK4, the clock interface CLKC of the gate driving circuit unit 94 is connected to the signal CLK6, and the clock interface CLKD of the gate driving circuit unit 94 is connected to the signal CLK7. The clock interface CLKA of the gate driving circuit unit (not shown) at the fifth stage is connected to the signal CLK5, and the clock interface CLKC thereof is connected to the signal CLK7, and the clock interface CLKD thereof is connected to the signal CLK8. The clock interface CLKA of the gate driving circuit unit (not shown) at the sixth stage is connected to the signal CLK6, the clock interface CLKC thereof is connected to the signal CLK8, and the clock interface CLKD thereof is connected to the signal CLK1. The clock interface CLKA of the gate driving circuit unit (not shown) at the seventh stage is connected to the signal CLK7, the clock interface CLKC thereof is connected to the signal CLK1, and the clock interface CLKD thereof is connected to the signal CLK2. The clock interface CLKA of the gate driving circuit unit (not shown) at the eighth stage is connected to the signal CLK8, the clock interface CLKC thereof is connected to the signal CLK2, and the clock interface CLKD thereof is connected to the signal CLK3 . . . and so on.

The connecting method of the other stages is that: if the remainder of the stage number divided by 8 is 1, the connecting method of the gate driving circuit unit at this stage is the same as that of the gate driving circuit unit at the first stage; if the remainder of the stage number divided by 8 is 2, the connecting method of the gate driving circuit unit at this stage is the same as that of the gate driving circuit unit at the second stage; if the remainder of the stage number divided by 8 is 3, the connecting method of the gate driving circuit unit at this stage is the same as that of the gate driving circuit unit at the third stage; if the remainder of the stage number divided by 8 is 4, the connecting method of the gate driving circuit unit at this stage is the same as that of the gate driving circuit unit at the fourth stage; if the remainder of the stage number divided by 8 is 5, the connecting method of the gate driving circuit unit at this stage is the same as that of the gate driving circuit unit at the fifth stage; if the remainder of the stage number divided by 8 is 6, the connecting method of the gate driving circuit unit at this stage is the same as that of the gate driving circuit unit at the sixth stage; if the remainder of the stage number divided by 8 is 7, the connecting method of the gate driving circuit unit at this stage is the same as that of the gate driving circuit unit at the seventh stage; if the stage number is divisible by 8, the connecting method of the gate driving circuit unit at this stage is the same as that of the gate driving circuit unit at the eighth stage.

Figure 10:
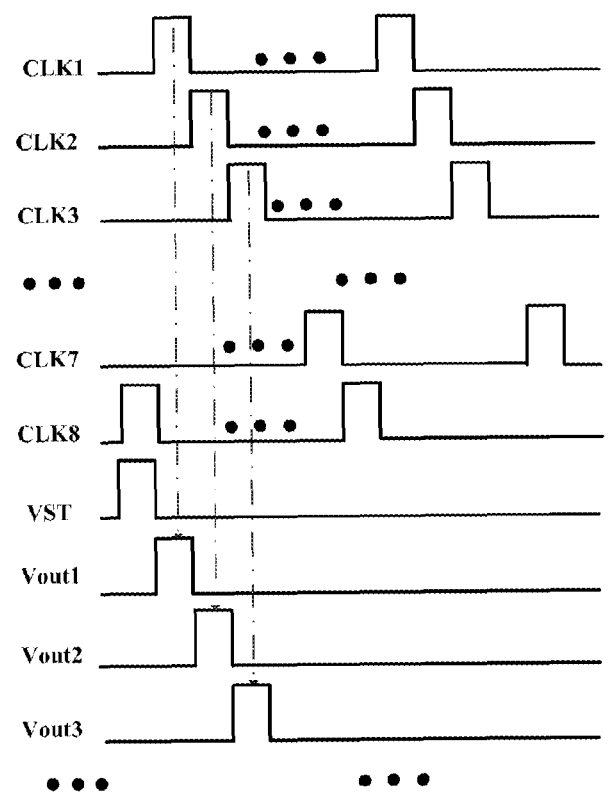
FIG. 10 is an exemplary signal diagram of a gate driving circuit of a gate driving circuit unit according to an embodiment of the present invention, wherein the gate driving circuit is driven by an eight-phase clock.

The operating signals with eight-phase clock driving are shown in FIG. 10. Applied with the above eight-phase clock signals and a start pulse signal, the gate driving circuit provides diving signals for each row of the panel 4 shown in FIG. 1.

Figure 11:
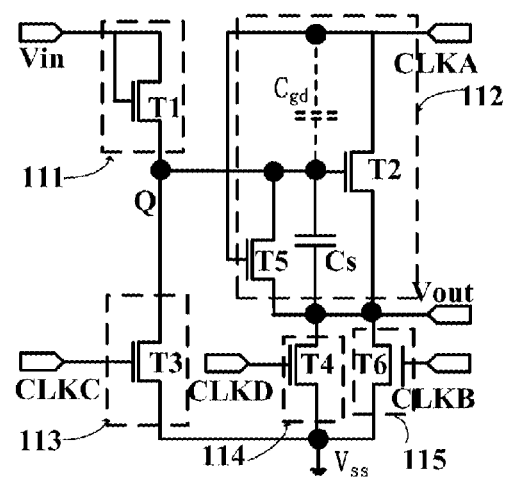
FIG. 11 is a circuit diagram exemplarily illustrating of a gate driving circuit unit according to another embodiment of the present invention.

The circuit structure of the gate driving circuit unit according to another embodiment is shown in FIG. 11. The gate driving circuit unit comprises: a signal input interface $V_{in}$, a signal output interface $V_{out}$, an input signal control module 111, a first clock signal control module 112, a second clock signal control module 115, a third clock signal control module 113 and a fourth clock signal control module 114. The signal input interface $V_{in}$ is used to receive an input pulse signal. If the present gate driving circuit unit is at the first stage, the input pulse signal is provided by the signal generator; if not, the input pulse signal is provided by the gate driving circuit unit at the previous stage, that is to say, the signal output interface of the gate driving circuit unit at the present stage is coupled to the signal output interface of the gate driving circuit unit at the previous stage. The signal output interface $V_{out}$ is used to output a driving signal to the corresponding scan line and the signal input interface of the gate driving circuit unit at the next stage. The first clock signal control module 112 comprises a driving unit and a clock feed-through suppressing unit. The driving unit comprises a control end used to input a driving voltage. After being activated by the driving voltage, the driving unit outputs the driving voltage to the signal output interface under the control of the first clock signal. The clock feed-through suppressing unit couples the control end to the signal output interface under the control of the first clock signal. The first clock signal lags one phase behind the input pulse signal. The input signal control module 111 is used to receive the input pulse signal from the signal input interface and provide the driving voltage to the control end of the driving unit under the control of the input pulse voltage. The second clock signal control module 115 is used to pull down the voltage of the signal output interface under the control of a second clock signal. The second clock signal lags one phase behind the first clock signal. The third clock signal control module 113 is used to provide the shutdown voltage to the control end of the driving unit under the control of a third clock signal, and the third clock signal lags two phases behind the first clock signal. The fourth clock signal control module 34 is used to pull down the voltage of the signal output interface under the control of a fourth clock signal, and the fourth clock signal is one phase ahead of the first clock signal. This embodiment differs from the above embodiment in that: a second clock signal control module is added and there are four clock signals. The first clock signal CLKA, the second clock signal CLKB, the third clock signal CLKC and the fourth clock signal CLKD are N-phase clock signals with the same working cycle, where N is an integer that is larger than or equal to 4. The second clock signal CLKB lags one phase behind the first clock signal CLKA. The third clock signal CLKC lags two phases behind the first clock signal CLKA. The fourth clock signal CLKD is one phase ahead of the first clock signal CLKA.

The circuit structure of the gate driving circuit according to another embodiment is shown in FIG. 11. The difference of this embodiment from the embodiment shown in FIG. 3 is that: the second clock signal control module 115 is added. In a particular example, the second clock signal control module 115 comprises a sixth transistor T6. The gate of the sixth transistor T6 responds to the second clock signal CLKB. The drain of the sixth transistor T6 is connected to the signal output interface $V_{out}$. The source of the sixth transistor T6 is connected to the first voltage source $V_{ss}$ for pulling down the potential of the signal output interface $V_{out}$ to $V_{ss}$ when the second clock signal CLKB becomes a high level.

In the pull-down stage, the second transistor T2 pulls down the voltage of the signal output interface $V_{out}$ to the low level of the first clock signal CLKA. Meanwhile, when the second clock signal CLKB becomes a high level, the sixth transistor will be switched on and connect the signal output interface $V_{out}$ to the voltage source $V_{ss}$, and pull down the voltage of the signal output interface $V_{out}$ to a low level under the pulling down of the second transistor T2 and the sixth transistor T6, so that the falling edge time of the output driving signal is shorter and the driving effect for the pixel array is better.

Furthermore, the sixth transistor T6 is additionally provided with one discharging access to the output interface $V_{out}$ so as to ensure that the output interface $V_{out}$ has no accumulation of the noise voltage during the low level maintenance stage, and thus contributes to the promotion of the low level stability of the output interface $V_{out}$.

Figure 12:
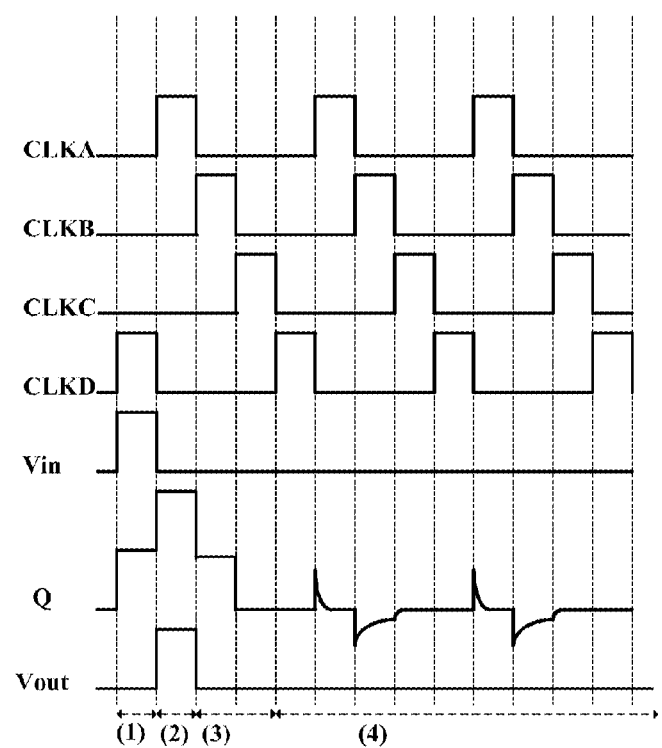
FIG. 12 is an exemplary signal diagram of a gate driving circuit unit according to another embodiment of the present invention.

The signal diagram of the present embodiment is shown in FIG. 12. The high potentials of the clock signals CLKA, CLKB, CLKC and CLKD are all $V_{dd}$, and their low potentials are all $V_{ss}$ and their duty cycles are all 25%. The input signal $V_{in}$ of this circuit is the output signal of the gate driving circuit unit at the previous stage. The output signal of the gate driving circuit unit at the present stage is $V_{out}$. The fundamental of the gate driving circuit unit of the present embodiment is the same as that of the gate driving circuit unit of the above embodiment, and its working processes comprise a precharge stage, a pull-up stage, a pull-down stage and a low level maintenance stage, the description of which is omitted.

In order to meet the requirement on the gate driving signal for the display device, when gate driving circuit units of several stages are connected in series and are connected to the N-phase clock signals, respectively, the clock signal of the gate driving circuit unit at a next stage lags one phase behind the corresponding clock signal of the gate driving circuit unit at the current stage.

Figure 13:
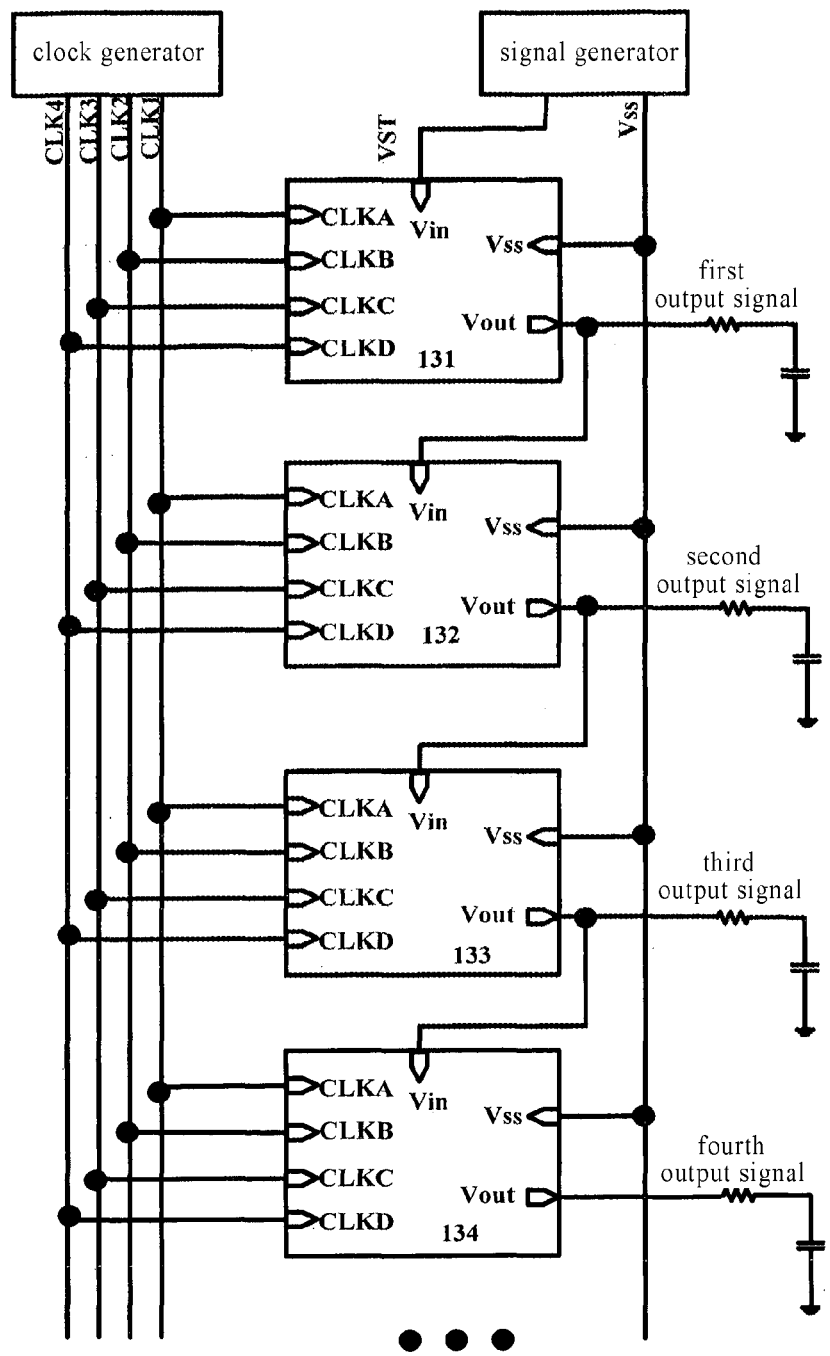
FIG. 13 is a circuit diagram exemplarily illustrating a gate driving circuit of a gate driving circuit unit according to another embodiment of the present invention, wherein the gate driving circuit is driven by a four-phase clock.

As shown in FIG. 13, the clock signals provided by the clock generator are four-phase signals CLK1, CLK2, CLK3 and CLK4 with a duty cycle of 25%. The connecting method of the clock of the gate driving circuit unit at each stage will be described as below.

The clock interface CLKA of the gate driving circuit unit 131 at the first stage is connected to the signal CLK1, the clock interface CLKB of the gate driving circuit unit 131 is connected to the signal CLK2, and the clock interface CLKC of the gate driving circuit unit 131 is connected to the signal CLK3, and the clock interface CLKD of the gate driving circuit unit 131 is connected to the signal CLK4. The clock interface CLKA of the gate driving circuit unit 132 at the second stage is connected to the signal CLK2, the clock interface CLKB of the gate driving circuit unit 132 is connected to the signal CLK3, the clock interface CLKC of the gate driving circuit unit 132 is connected to the signal CLK4, and the clock interface CLKD of the gate driving circuit unit 132 is connected to the signal CLK1. The clock interface CLKA of the gate driving circuit unit 133 at the third stage is connected to the signal CLK3, the clock interface CLKB of the gate driving circuit unit 133 is connected to the signal CLK4, the clock interface CLKC of the gate driving circuit unit 133 is connected to the signal CLK1, and the clock interface CLKD of the gate driving circuit unit 133 is connected to the signal CLK2. The clock interface CLKA of the gate driving circuit unit 134 at the fourth stage is connected to the signal CLK4, and the clock interface CLKB of the gate driving circuit unit 134 is connected to the signal CLK1, the clock interface CLKC of the gate driving circuit unit 134 is connected to the signal CLK2, and the clock interface CLKD of the gate driving circuit unit 134 is connected to the signal CLK3.

The connecting method of the other stages is that: if the remainder of the stage number divided by 4 is 1, the connecting method of the gate driving circuit unit at this stage is the same as that of the gate driving circuit unit at the first stage; if the remainder of the stage number divided by 4 is 2, the connecting method of the gate driving circuit unit at this stage is the same as that of the gate driving circuit unit at the second stage; if the remainder of the stage number divided by 4 is 3, the connecting method of the gate driving circuit unit at this stage is the same as that of the gate driving circuit unit at the third stage; if the stage number is divisible by 4, the connecting method of the gate driving circuit unit at this stage is the same as that of the gate driving circuit unit at the fourth stage.

Figure 14:
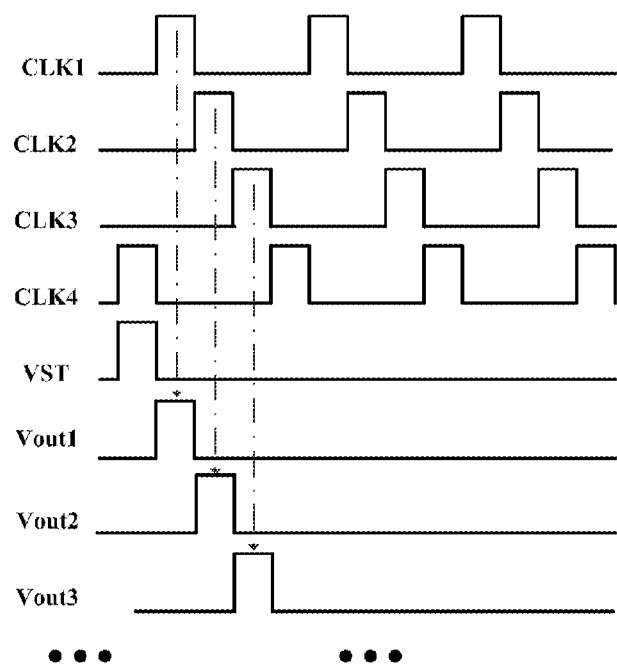
FIG. 14 is an exemplary signal diagram of a gate driving circuit of a gate driving circuit unit according to another embodiment of the present invention, wherein the gate driving circuit is driven by a four-phase clock.

The signal diagram of the present embodiment when using the four-phase clock signals is shown in FIG. 14.

If the phase number of the signal provided by the clock generator is more than 4, the connecting method of the clock interface of the gate driving circuit at each stage needs to meet the requirement on the phase of the clock interface CLKA, CKLB, CLKC and CLKD. The connecting method of the clock interface of the gate driving circuit at each stage and the signal diagram when driven by different clocks are shown in FIG. 15-FIG. 16

Figure 15:
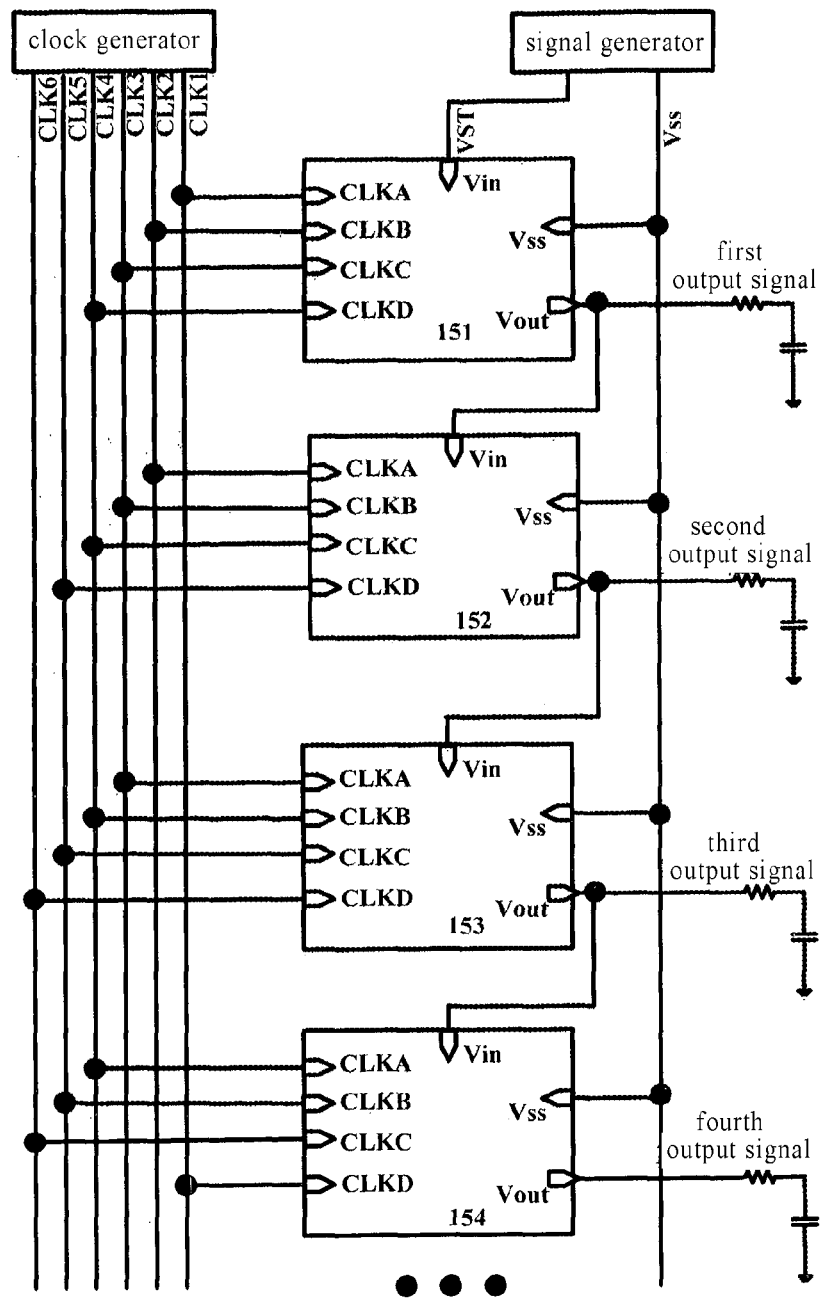
FIG. 15 is a circuit diagram exemplarily illustrating a gate driving circuit of a gate driving circuit unit according to another embodiment of the present invention, wherein the gate driving circuit is driven by a six-phase clock.

The circuit diagram of the present embodiment when using the six-phase clock signals is shown in FIG. 15.

Figure 16:
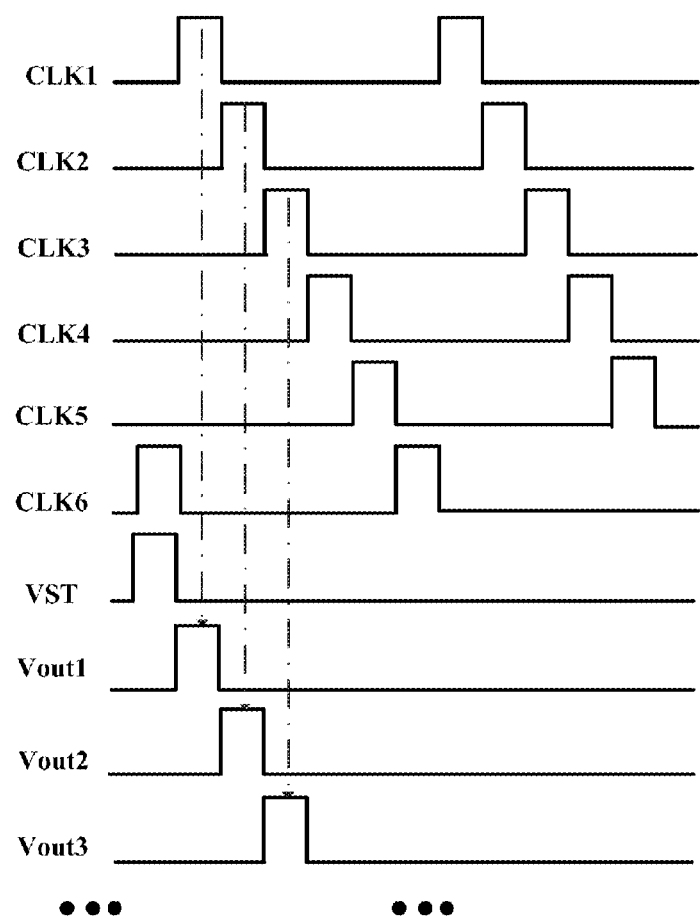
FIG. 16 is an exemplary signal diagram of a gate driving circuit of a gate driving circuit unit according to another embodiment of the present invention, wherein the gate driving circuit is driven by a six-phase clock.

The signal diagram of the present embodiment when using the six-phase clock signals is shown in FIG. 16.

Furthermore, although the single transistor is unitized in the input signal control module, the driving unit, the third clock signal control module, the second clock signal control module, the fourth clock signal control module and the clock feed-through suppressing unit in the above embodiments, multiple transistors my be utilized in at least one of those modules in another embodiments.

In conclusion, the solutions according to the embodiments of the present application have the following advantages.

Firstly, in the gate driving circuit, the pull-up and pull-down are accomplished by one transistor. On the contrary, in the case when the two-phase clock is used, the pull-up and pull-down are carried out by two different transistors. So, the layout area of the circuit of the present application is relatively small.

Secondly, in normal integrated gate driving circuit designs, it needs to use the output signal of the next stage to pull down the current stage, but it is not necessary for the circuit as claimed in the present application to use the output signal of the next stage. This not only reduces the load capacity for the unit circuit at the next stage, but also reduces the increasing of the pull-down delay time at the current stage due to the pull-up delay of the next unit circuit.

Thirdly, in the present application, each gate driving circuit unit only comprises 5 or 6 transistors. However, in normal two-phase clock driving in the prior art, 10 or more transistors are always needed. For this reason, the gate driving circuit unit according to the present application needs fewer transistors and has a simple circuit, a small occupied area and a higher finished product rate.

Fourthly, the voltage stress on the pull-down transistor in the gate driving circuit unit according to the present application is less than that of the conventional circuit, thereby the drift of the threshold voltage of the transistor is small, and the degradation of the electrical characteristics is reduced. Accordingly, the gate driving circuit of the present application has a better stability.

Fifthly, the multi-phase clock control is utilized in the gate driving circuit of the present application, so the power consumption for the circuit is less than that of the gate driving circuit using the conventional two-phase clock control.

In addition, the gate driving circuit of the present application may be composed of amorphous silicon thin film transistors, and may be integrated, together with the pixel array, on the panel of the display device.

The detailed descriptions of the present application have been described in reference to the above embodiments. It should be understood that those descriptions are just given for ease of understanding of the solutions to be claimed. It should never be assumed that the implementations of the claimed solutions are only limited to such descriptions. It is impossible for those skilled in the art to anticipate various equivalents and alternatives within the concept of the present invention.

What is claimed is:

1. A gate driving circuit unit comprising:
a signal input interface for receiving an input pulse signal;
a signal output interface for outputting a driving signal;
a first clock signal control module comprising:
   a driving unit comprising a control end that transfers a first clock signal to the signal output interface after applied with a driving voltage; and
   a clock feed-through suppressing unit that couples the control end to the signal output interface under control of the first clock signal; wherein the first clock signal lags one phase behind the input pulse signal;
an input signal control module that receives the input pulse signal from the signal input interface and provides the driving voltage for the control end;
a third clock signal control module that provides a shutdown voltage for the control end under control of a third clock signal, the third clock signal lagging two phases behind the first clock signal; and
a fourth clock signal control module that pulls down the voltage of the signal output interface under control of a fourth clock signal, the fourth clock signal being one phase ahead of the first clock signal.

2. The gate driving circuit unit of claim 1, wherein the first clock signal, the third clock signal and the fourth clock signal are of N-phase clock signals with a same cycle, where N is an integer that is larger than or equal to 4; and one phase has an value of $2\pi/N$.

3. The gate driving circuit unit of claim 2, wherein the output end of the input signal control module is coupled to the control end of the driving unit to charge the control end under control of the input pulse signal; and
wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

4. The gate driving circuit unit of claim 3, wherein the input signal control module comprises a first transistor, a control electrode and a first main current conduct electrode of the first transistor receiving the input pulse signal, a second main current conduct electrode of the first transistor providing the driving voltage;
wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on with the driving voltage, the signal output interface is charged when the first clock signal becomes a high level and a potential of the signal output interface is pulled down when the first clock signal becomes a low level;
wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;
wherein the third clock signal control module comprises a third transistor, wherein the control electrode of the third transistor responds to the third clock signal, a first main current conduct electrode of the third transistor is coupled to the control electrode of the second transistor, and a second main current conduct electrode of the third transistor is coupled to the first voltage source, such that a potential of the control electrode of the second transistor is pulled down to the voltage of the first voltage source when the third clock signal becomes a high level; and
wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

5. The gate driving circuit unit of claim 4, wherein the clock feed-through suppressing unit further comprises a storage capacitance connected between the control electrode and the second main current conduct electrode of the second transistor.

6. The gate driving circuit unit of claim 1, wherein the output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

7. The gate driving circuit unit of claim 6, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on with the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the third clock signal control module comprises a third transistor, wherein the control electrode of the third transistor responds to the third clock signal, a first main current conduct electrode of the third transistor is coupled to the control electrode of the second transistor, and a second main current conduct electrode of the third transistor is coupled to the first voltage source, such that a potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

8. The gate driving circuit unit of claim 7, wherein the clock feed-through suppressing unit further comprises a storage capacitance connected between the control electrode and the second main current conduct electrode of the second transistor.

9. A gate driving circuit unit comprising:
   a signal input interface for receiving an input pulse signal;
   a signal output interface for outputting a driving signal;
   a first clock signal control module comprising:
      a driving unit comprising a control end for transferring a first clock signal to the signal output interface after applied with a driving voltage; and
      a clock feed-through suppressing unit for coupling the control end to the signal output interface under control of the first clock signal; wherein the first clock signal lags one phase behind the input pulse signal;
   an input signal control module for receiving the input pulse signal from the signal input interface, and providing a driving voltage for the driving unit under control of the input pulse signal;
   a second clock signal control module for pulling down a voltage of the signal output interface under control of a second clock signal, the second clock signal lagging one phase behind the first clock signal;
   a third clock signal control module for providing a shut-down voltage for the control end under control of a third clock signal, the third clock signal lagging two phases behind the first clock signal; and
   a fourth clock signal control module for pulling down a voltage of the signal output interface under control of a fourth clock signal, the fourth clock signal being one phase ahead of the first clock signal.

10. The gate driving circuit unit of claim 9, wherein the first clock signal, the second clock signal, the third clock signal and the fourth clock signal are of M-phase clock signals with a same cycle, where M is an integer that is larger than or equal to 4; and the value of one phase equals to $2\pi/M$.

11. The gate driving circuit unit of claim 10, wherein an output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

12. The gate driving circuit unit of claim 11, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on by the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the second clock signal control module comprises a sixth transistor, the control electrode of which responds to the second clock signal, a first main current conduct electrode of which is coupled to the signal output interface, and a second main current conduct electrode of which is coupled to the first voltage source, such that a voltage of the signal output interface is pulled down to the voltage of the first voltage source when the second clock signal becomes a high level;

wherein the third clock signal control module comprises a third transistor, the control electrode of which responds to the third clock signal, a first main current conduct electrode of which is coupled to the control electrode of the second transistor, and a second main current conduct electrode of which is coupled to the first voltage source, such that the potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

13. The gate driving circuit unit of claim 12, wherein the clock feed-through suppressing unit further comprises a storage capacitance connected between the control electrode of the second transistor and the second main current conduct electrode of the second transistor.

14. The gate driving circuit unit of claim 9, wherein an output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

15. The gate driving circuit unit of claim 14, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on by the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the second clock signal control module comprises a sixth transistor, the control electrode of which responds to the second clock signal, a first main current conduct electrode of which is coupled to the signal output interface, and a second main current conduct electrode of which is coupled to the first voltage source, such that a voltage of the signal output interface is pulled down to the voltage of the first voltage source when the second clock signal becomes a high level;

wherein the third clock signal control module comprises a third transistor, the control electrode of which responds to the third clock signal, a first main current conduct electrode of which is coupled to the control electrode of the second transistor, and a second main current conduct electrode of which is coupled to the first voltage source, such that the potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

16. The gate driving circuit unit of claim 15, wherein the clock feed-through suppressing unit further comprises a storage capacitance connected between the control electrode of the second transistor and the second main current conduct electrode of the second transistor.

17. A gate driving circuit comprising a plurality of stages of gate driving circuit units connected in series, wherein a signal output interface of a next unit of the gate driving circuit units is coupled to a signal input interface of a current unit of the gate driving circuit units, and a clock signal applied to the next unit lags one phase behind that applied to the current unit, and wherein the gate driving circuit unit comprises:
  a signal input interface for receiving an input pulse signal;
  a signal output interface for outputting a driving signal;
  a first clock signal control module comprising:
    a driving unit comprising a control end for transferring a first clock signal to the signal output interface after applied with a driving voltage; and
    a clock feed-through suppressing unit for coupling the control end to the signal output interface under control of the first clock signal; wherein the first clock signal lags one phase behind the input pulse signal;

an input signal control module for receiving the input pulse signal from the signal input interface and providing the driving voltage for the control end;

a third clock signal control module for providing a shutdown voltage for the control end under control of a third clock signal, the third clock signal lagging two phases behind the first clock signal; and a fourth clock signal control module for pulling down the voltage of the signal output interface under control of a fourth clock signal, the fourth clock signal being one phase ahead of the first clock signal.

18. The gate driving circuit of claim 17, wherein the first clock signal, the third clock signal and the fourth clock signal are of N-phase clock signals with a same cycle, where N is an integer that is larger than or equal to 4; and one phase has an value of $2\pi/N$.

19. The gate driving circuit of claim 18, wherein the output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

20. The gate driving circuit of claim 19, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on with the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the third clock signal control module comprises a third transistor, wherein the control electrode of the third transistor responds to the third clock signal, a first main current conduct electrode of the third transistor is coupled to the control electrode of the second transistor, and a second main current conduct electrode of the third transistor is coupled to the first voltage source, such that a potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

21. The gate driving circuit of claim 20, wherein the clock feed-through suppressing unit further comprises a storage capacitance connected between the control electrode and the second main current conduct electrode of the second transistor.

22. The gate driving circuit of claim 17, wherein the output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

23. The gate driving circuit of claim 22, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on with the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the third clock signal control module comprises a third transistor, wherein the control electrode of the third transistor responds to the third clock signal, a first main current conduct electrode of the third transistor is coupled to the control electrode of the second transistor, and a second main current conduct electrode of the third transistor is coupled to the first voltage source, such that a potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

24. The gate driving circuit of claim 23, wherein the clock feed-through suppressing unit further comprises a storage capacitance connected between the control electrode and the second main current conduct electrode of the second transistor.

25. A display device comprising:
a panel comprising a two-dimensional pixel array consisted of a plurality of pixels;
a plurality of data lines in a first direction and a plurality of gate scanning lines in a second direction, both of the data lines and the gate scanning lines being connected to each pixel array; and
a data driving circuit for providing an image signal for the data lines;
wherein the display device further comprises a gate driving circuit for providing a driving signal for the gate scanning lines,
wherein the gate driving circuit comprises a plurality of stages of gate driving circuit units connected in series,
wherein a signal output interface of a next unit of the gate driving circuit units is coupled to a signal input interface of a current unit of the gate driving circuit units, and a clock signal applied to the next unit lags one phase behind that applied to the current unit, and
wherein the gate driving circuit unit comprises:
a signal input interface for receiving an input pulse signal;
a signal output interface for outputting a driving signal;
a first clock signal control module comprising:
a driving unit comprising a control end for transferring a first clock signal to the signal output interface after applied with a driving voltage; and
a clock feed-through suppressing unit for coupling the control end to the signal output interface under control of the first clock signal; wherein the first clock signal lags one phase behind the input pulse signal;
an input signal control module for receiving the input pulse signal from the signal input interface and providing the driving voltage for the control end;
a third clock signal control module for providing a shutdown voltage for the control end under control of a third clock signal, the third clock signal lagging two phases behind the first clock signal; and
a fourth clock signal control module for pulling down the voltage of the signal output interface under control of a fourth clock signal, the fourth clock signal being one phase ahead of the first clock signal.

26. The display device of claim 25, wherein the first clock signal, the third clock signal and the fourth clock signal are of N-phase clock signals with a same cycle, where N is an integer that is larger than or equal to 4; and one phase has an value of $2\pi/N$.

27. The display device of claim 26, wherein the output end of the input signal control module is coupled to the control end of the driving unit to charge the control end under control of the input pulse signal; and
wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

28. The display device of claim 27, wherein the input signal control module comprises a first transistor, a control electrode and a first main current conduct electrode of the first transistor receiving the input pulse signal, a second main current conduct electrode of the first transistor providing the driving voltage;
wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on with the driving voltage, the signal output interface is charged when the first clock signal becomes a high level and a potential of the signal output interface is pulled down when the first clock signal becomes a low level;
wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;
wherein the third clock signal control module comprises a third transistor, wherein the control electrode of the third transistor responds to the third clock signal, a first main current conduct electrode of the third transistor is coupled to the control electrode of the second transistor, and a second main current conduct electrode of the third transistor is coupled to the first voltage source, such that a potential of the control electrode of the second transistor is pulled down to the voltage of the first voltage source when the third clock signal becomes a high level; and
wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

29. The display device of claim 28, wherein the clock feed-through suppressing unit further comprises a storage capacitance connected between the control electrode and the second main current conduct electrode of the second transistor.

30. The display device of claim 25, wherein the output end of the input signal control module is coupled to the control end of the driving unit to charge the control end under control of the input pulse signal; and
wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

31. The display device of claim 30, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on with the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the third clock signal control module comprises a third transistor, wherein the control electrode of the third transistor responds to the third clock signal, a first main current conduct electrode of the third transistor is coupled to the control electrode of the second transistor, and a second main current conduct electrode of the third transistor is coupled to the first voltage source, such that a potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

32. The display device of claim 31, wherein the clock feed-through suppressing unit further comprises a storage capacitance connected between the control electrode and the second main current conduct electrode of the second transistor.

33. A gate driving circuit comprising a plurality of stages of gate driving circuit units connected in series, wherein a signal output interface of a next unit of the gate driving circuit units is coupled to a signal input interface of a current unit of the gate driving circuit units, and a clock signal applied to the next unit lags one phase behind that applied to the current unit, and wherein the gate driving circuit unit comprises:
a signal input interface for receiving an input pulse signal;
a signal output interface for outputting a driving signal;
a first clock signal control module comprising:
a driving unit comprising a control end for transferring a first clock signal to the signal output interface after applied with a driving voltage; and
a clock feed-through suppressing unit for coupling the control end to the signal output interface under control of the first clock signal; wherein the first clock signal lags one phase behind the input pulse signal;

an input signal control module for receiving the input pulse signal from the signal input interface, and providing a driving voltage for the driving unit under control of the input pulse signal;

a second clock signal control module for pulling down a voltage of the signal output interface under control of a second clock signal, the second clock signal lagging one phase behind the first clock signal;

a third clock signal control module for providing a shutdown voltage for the control end under control of a third clock signal, the third clock signal lagging two phases behind the first clock signal; and a fourth clock signal control module for pulling down a voltage of the signal output interface under control of a fourth clock signal, the fourth clock signal being one phase ahead of the first clock signal.

34. The gate driving circuit of claim 33, wherein the first clock signal, the second clock signal, the third clock signal and the fourth clock signal are of M-phase clock signals with a same cycle, where M is an integer that is larger than or equal to 4; and the value of one phase equals to $2\pi/M$.

35. The gate driving circuit of claim 34, wherein an output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

36. The gate driving circuit of claim 35, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on by the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the second clock signal control module comprises a sixth transistor, the control electrode of which responds to the second clock signal, a first main current conduct electrode of which is coupled to the signal output interface, and a second main current conduct electrode of which is coupled to the first voltage source, such that a voltage of the signal output interface is pulled down to the voltage of the first voltage source when the second clock signal becomes a high level;

wherein the third clock signal control module comprises a third transistor, the control electrode of which responds to the third clock signal, a first main current conduct electrode of which is coupled to the control electrode of the second transistor, and a second main current conduct electrode of which is coupled to the first voltage source, such that the potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

37. The gate driving circuit of claim 36, wherein the clock feed-through suppressing unit further comprises a storage capacitance connected between the control electrode of the second transistor and the second main current conduct electrode of the second transistor.

38. The gate driving circuit of claim 33, wherein an output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

39. The gate driving circuit of claim 38, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on by the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the second clock signal control module comprises a sixth transistor, the control electrode of which responds to the second clock signal, a first main current conduct electrode of which is coupled to the signal output interface, and a second main current conduct electrode of which is coupled to the first voltage source, such that a voltage of the signal output interface is pulled down to the voltage of the first voltage source when the second clock signal becomes a high level;

wherein the third clock signal control module comprises a third transistor, the control electrode of which responds to the third clock signal, a first main current conduct electrode of which is coupled to the control electrode of the second transistor, and a second main current conduct electrode of which is coupled to the first voltage source, such that the potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

40. The gate driving circuit of claim 39, wherein the clock feed-through suppressing unit further comprises a storage capacitance connected between the control electrode of the second transistor and the second main current conduct electrode of the second transistor.

41. A display device comprising:
a panel comprising a two-dimensional pixel array consisted of a plurality of pixels;
a plurality of data lines in a first direction and a plurality of gate scanning lines in a second direction, both of the data lines and the gate scanning lines being connected to each pixel array; and
a data driving circuit for providing an image signal for the data lines;
wherein the display device further comprises a gate driving circuit for providing a driving signal for the gate scanning lines,
wherein the gate driving circuit comprises a plurality of stages of gate driving circuit units connected in series,
wherein a signal output interface of a next unit of the gate driving circuit units is coupled to a signal input interface of a current unit of the gate driving circuit units, and a clock signal applied to the next unit lags one phase behind that applied to the current unit, and
wherein the gate driving circuit unit comprises:
a signal input interface for receiving an input pulse signal;
a signal output interface for outputting a driving signal;
a first clock signal control module comprising:
a driving unit comprising a control end for transferring a first clock signal to the signal output interface after applied with a driving voltage; and a clock feed-through suppressing unit for coupling the control end to the signal output interface under control of the first clock signal; wherein the first clock signal lags one phase behind the input pulse signal;

an input signal control module for receiving the input pulse signal from the signal input interface, and providing a driving voltage for the driving unit under control of the input pulse signal;

a second clock signal control module for pulling down a voltage of the signal output interface under control of a second clock signal, the second clock signal lagging one phase behind the first clock signal;

a third clock signal control module for providing a shutdown voltage for the control end under control of a third clock signal, the third clock signal lagging two phases behind the first clock signal; and a fourth clock signal control module for pulling down a voltage of the signal output interface under control of a fourth clock signal, the fourth clock signal being one phase ahead of the first clock signal.

42. The display device of claim 41, wherein the first clock signal, the second clock signal, the third clock signal and the fourth clock signal are of M-phase clock signals with a same cycle, where M is an integer that is larger than or equal to 4; and the value of one phase equals to $2\pi/M$.

43. The display device of claim 42, wherein an output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

44. The display device of claim 43, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on by the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the second clock signal control module comprises a sixth transistor, the control electrode of which responds to the second clock signal, a first main current conduct electrode of which is coupled to the signal output interface, and a second main current conduct electrode of which is coupled to the first voltage source, such that a voltage of the signal output interface is pulled down to the voltage of the first voltage source when the second clock signal becomes a high level;

wherein the third clock signal control module comprises a third transistor, the control electrode of which responds to the third clock signal, a first main current conduct electrode of which is coupled to the control electrode of the second transistor, and a second main current conduct electrode of which is coupled to the first voltage source, such that the potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

45. The display device of claim 44, wherein the clock feed-through suppressing unit further comprises a storage capacitance connected between the control electrode of the second transistor and the second main current conduct electrode of the second transistor.

46. The display device of claim 41, wherein an output end of the input signal control module is coupled to the control end of the driving unit to charge the control end under control of the input pulse signal; and wherein a first end of the third clock signal control module responds to the third clock signal, a second end of the third clock signal control module is coupled to the control end, a third end of the third clock signal control module is coupled to a first voltage source, and the third clock signal control module pulls down a voltage of the control end unit under the control of the third clock signal.

47. The display device of claim 46, wherein the input signal control module comprises a first transistor, a control electrode and a first main current conduct electrode of the first transistor receiving the input pulse signal, a second main current conduct electrode of the first transistor providing the driving voltage;

wherein the driving unit comprises a second transistor, wherein a control electrode of the second transistor is coupled to the second main current conduct electrode of the first transistor, the first clock signal is input to a first main current conduct electrode of the second transistor, a second main current conduct electrode of the second transistor is coupled to the signal output interface, such that, after the second transistor is switched on by the driving voltage, the signal output interface is charged when the first clock signal becomes a high level and a potential of the signal output interface is pulled down when the first clock signal becomes a low level;

wherein the clock feed-through suppressing unit comprises a fifth transistor, a control electrode of which responds to the first clock signal, a first main current conduct electrode of which is coupled to the control electrode of the second transistor, a second main current conduct electrode of which is coupled to the signal output interface, such that the control electrode of the second transistor is coupled to the signal output interface when the first clock signal becomes a high level;

wherein the second clock signal control module comprises a sixth transistor, the control electrode of which responds to the second clock signal, a first main current conduct electrode of which is coupled to the signal output interface, and a second main current conduct electrode of which is coupled to the first voltage source, such that a voltage of the signal output interface is pulled down to the voltage of the first voltage source when the second clock signal becomes a high level;

wherein the third clock signal control module comprises a third transistor, the control electrode of which responds to the third clock signal, a first main current conduct electrode of which is coupled to the control electrode of the second transistor, and a second main current conduct electrode of which is coupled to the first voltage source, such that the potential of the control electrode of the second transistor is pulled down to the voltage of the first voltage source when the third clock signal becomes a high level; and wherein the fourth clock signal control module comprises a fourth transistor, the control electrode of which responds to the fourth clock signal, a first main current conduct electrode of which is coupled to the signal output interface, and a second main current conduct electrode of which is coupled to the first voltage source, such that the voltage of the signal output interface is pulled down to the voltage of the first voltage source when the fourth clock signal becomes a high level.

48. The display device of claim 47, wherein the clock feed-through suppressing unit further comprises a storage capacitance connected between the control electrode of the second transistor and the second main current conduct electrode of the second transistor.

* * * * *